United States Patent
Arai et al.

(10) Patent No.: US 6,836,195 B2
(45) Date of Patent: Dec. 28, 2004

(54) TRANSMISSION LINE TYPE NOISE FILTER WITH SMALL SIZE AND SIMPLE STRUCTURE, HAVING EXCELLENT NOISE REMOVING CHARACTERISTIC OVER WIDE BAND INCLUDING HIGH FREQUENCY BAND

(75) Inventors: Satoshi Arai, Sendai (JP); Takayuki Inoi, Sendai (JP); Yoshihiko Saiki, Sendai (JP); Sadamu Toita, Sendai (JP)

(73) Assignee: NEC TOKIN Corporation, Sendai (JP)

( * ) Notice: Subject to any disclaimer, the term of this patent is extended or adjusted under 35 U.S.C. 154(b) by 28 days.

(21) Appl. No.: 10/449,557

(22) Filed: May 30, 2003

(65) Prior Publication Data

US 2003/0222734 A1 Dec. 4, 2003

(30) Foreign Application Priority Data

May 31, 2002 (JP) ...................................... 2002-158526

(51) Int. Cl.$^7$ ................................................ H03H 7/00
(52) U.S. Cl. ...................................... 333/182; 333/184
(58) Field of Search ................................. 333/182, 183, 333/184, 185, 167, 172, 134, 204

(56) References Cited

U.S. PATENT DOCUMENTS

| 4,641,140 A | 2/1987 | Heckaman et al. |
| 4,701,576 A | 10/1987 | Wada et al. |
| 5,500,629 A | 3/1996 | Meyer |
| 6,094,115 A | 7/2000 | Nguyen et al. |
| 6,646,523 B2 * | 11/2003 | Arai et al. .................. 333/184 |

\* cited by examiner

*Primary Examiner*—Michael Tokar
*Assistant Examiner*—Joseph Lauture
(74) *Attorney, Agent, or Firm*—Frishauf, Holtz, Goodman & Chick, P.C.

(57) ABSTRACT

A transmission line type noise filter includes a metal fine wire (1) made of valve-operational metal and serving as a central conductor, a capacitance forming portion (3) formed over a predetermined length on the periphery of the metal fine wire, and a conductor layer (2) formed on the surface of the capacitance forming portion and serving as an external conductor. The capacitance forming portion (3) includes a sintered body (11) formed on the metal fine wire and made of the foregoing valve-operational metal, a dielectric film (31) formed on the surface of the sintered body and serving as a dielectric, and a solid electrolyte layer (23) formed on the surface of the dielectric film.

8 Claims, 5 Drawing Sheets

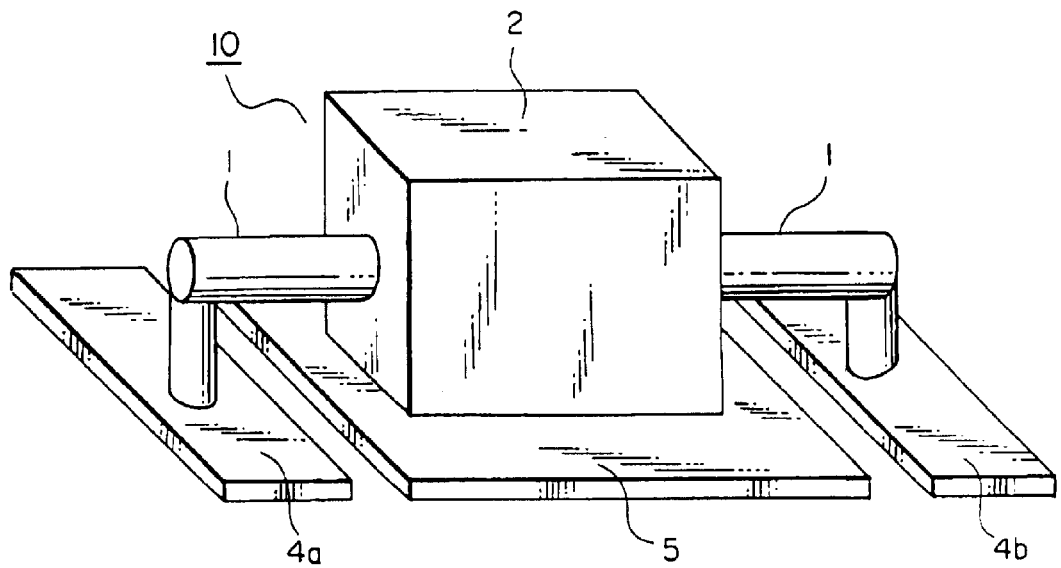
FIG. 1A
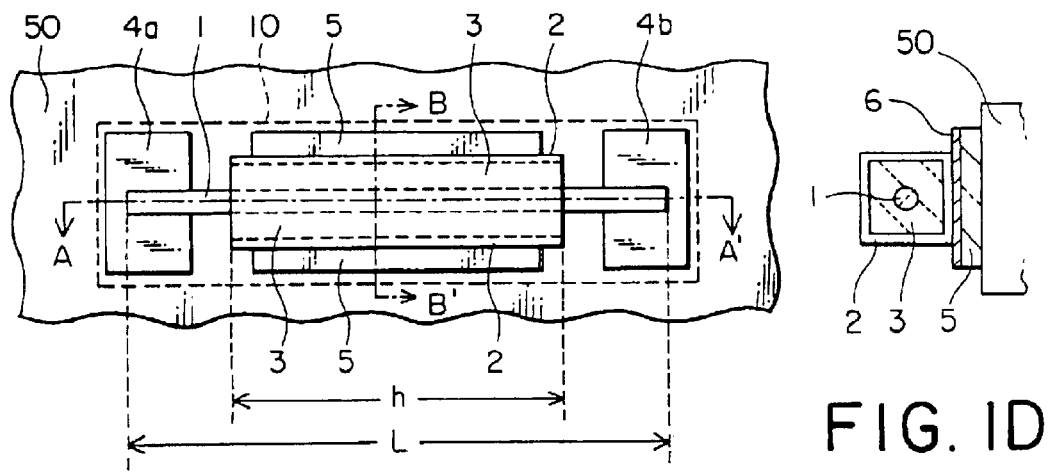
FIG. 1B
FIG. 1D
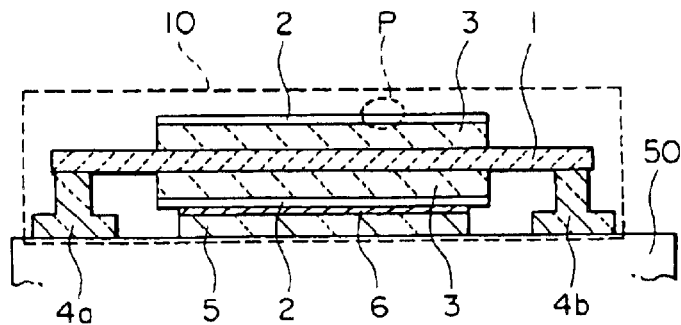
FIG. 1C

TRANSMISSION LINE TYPE NOISE FILTER WITH SMALL SIZE AND SIMPLE STRUCTURE, HAVING EXCELLENT NOISE REMOVING CHARACTERISTIC OVER WIDE BAND INCLUDING HIGH FREQUENCY BAND

This application claims priority to prior application JP 2002-158526, the disclosure of which is incorporated herein by reference.

BACKGROUND OF THE INVENTION

The present invention relates to a noise filter that is mounted in an electronic device or electronic equipment for removing noise generated therein.

Digital technologies are important technologies supporting IT (Information Technology) industries. Recently, digital circuit technologies such as LSI (Large Scale Integration) have been used in not only computers and communication-related devices, but also household electric appliances and vehicle equipment.

High-frequency noise currents generated in LSI chips or the like do not stay in the neighborhood of the LSI chips but spread over wide ranges within mounting circuit boards such as printed circuit boards, and are subjected to inductive coupling in signal wiring or ground wiring, thereby leading from signal cables or the like as electromagnetic waves.

In those circuits each including an analog circuit and a digital circuit, such as a circuit in which part of a conventional analog circuit is replaced with a digital circuit, or a digital circuit having analog input and output, electromagnetic interference from the digital circuit to the analog circuit has been becoming a serious problem.

As a countermeasure therefor, a technique of power supply decoupling is effective wherein an LSI chip as a source of generation of high-frequency current is separated from a dc power supply system in terms of high frequencies. Noise filters such as bypass capacitors have been used hitherto as decoupling elements, and the operation principle of the power supply decoupling is simple and clear.

The capacitors as noise filters used in conventional ac circuits form two-terminal lumped constant noise filters and solid electrolytic capacitors, electric double-layer capacitors, ceramic capacitors or the like are often used therefor.

When carrying out removal of electrical noise in an ac circuit over a wide frequency band, inasmuch as a frequency band that can be dealt with by one capacitor is relatively narrow, different kinds of capacitors, for example, an aluminum electrolytic capacitor, a tantalum capacitor and a ceramic capacitor having different self-resonance frequencies, are provided in the ac circuit.

Conventionally, however, it has been bothersome to select and design a plurality of noise filters that are used for removing electrical noise of a wide frequency band. In addition, there has been a problem that, because of using different kinds of the noise filters, the cost is high, the size is large, and the weight is heavy.

Further, as described above, for dealing with higher-speed and higher-frequency digital circuits, there have been demanded those noise filters that can ensure decoupling over a high frequency band and exhibit low impedances even in the high frequency band.

However, the two-terminal lumped constant noise filters have difficulty in maintaining low impedances up to the high frequency band due to self-resonance phenomena of capacitors, and thus are inferior in performance of removing high-frequency band noise.

Further, the electronic equipment or devices with the LSI chips or the like mounted therein have been required to be further reduced in size, weight and cost. Therefore, the noise filters that are used in those electronic equipment or devices have also been required to be further reduced in size, to be structured more simply, and to be manufactured more easily.

SUMMARY OF THE INVENTION

Therefore, it is an object of the present invention to provide a transmission line type noise filter that is excellent in noise removing characteristic over a wide band including a high frequency band and that has a small size and a simple structure.

A transmission line type-noise filter according to the present invention has a central conductor, an external conductor, and a dielectric formed between the central conductor and the external conductor, and is characterized by comprising a metal fine wire made of valve-operational metal and serving as the central conductor; a capacitance forming portion formed over a predetermined length on the periphery of the metal fine wire; and a conductor layer formed on a surface of the capacitance forming portion and serving as the external conductor, wherein the capacitance forming portion comprises a sintered body formed on the metal fine wire and made of the foregoing valve-operational metal; a dielectric film formed on a surface of the sintered body and serving as the dielectric; and a solid electrolyte layer formed on a surface of the dielectric film.

The sintered body may be formed by press-molding powder of the valve-operational metal, then sintering it at a predetermined temperature, or may be formed by winding a green sheet formed from slurry including powder of the valve-operational metal, around the metal fine wire as a core, then sintering it at a predetermined temperature.

The dielectric film may be an oxidized film of the valve-operational metal.

The valve-operational metal may be tantalum or niobium.

The solid electrolyte layer may be formed by a single conductive high molecular compound layer or a plurality of conductive high molecular compound layers.

The transmission line type noise filter may further comprise a first and a second anode terminal connected to both ends of the metal fine wire, respectively; a cathode terminal connected to the conductor layer; and a resin package covering the metal fine wire, the capacitance forming portion and the conductor layer, excluding at least portions of the first and second anode terminals and the cathode terminal, respectively, thereby to be formed as an electronic element.

Other objects, features and advantages of the present invention will become apparent from the following description of this specification.

BRIEF DESCRIPTION OF THE DRAWINGS

FIGS. 1A to 1D are diagrams showing a transmission line type noise filter according to a first preferred embodiment of the present invention, wherein FIG. 1A is an exemplary external perspective view, FIG. 1B is a plan view, and FIGS. 1C and 1D are sectional views taken along line A–A' and line B–B' of FIG. 1B, respectively;

DESCRIPTION OF THE PREFERRED EMBODIMENTS

Figure 2:
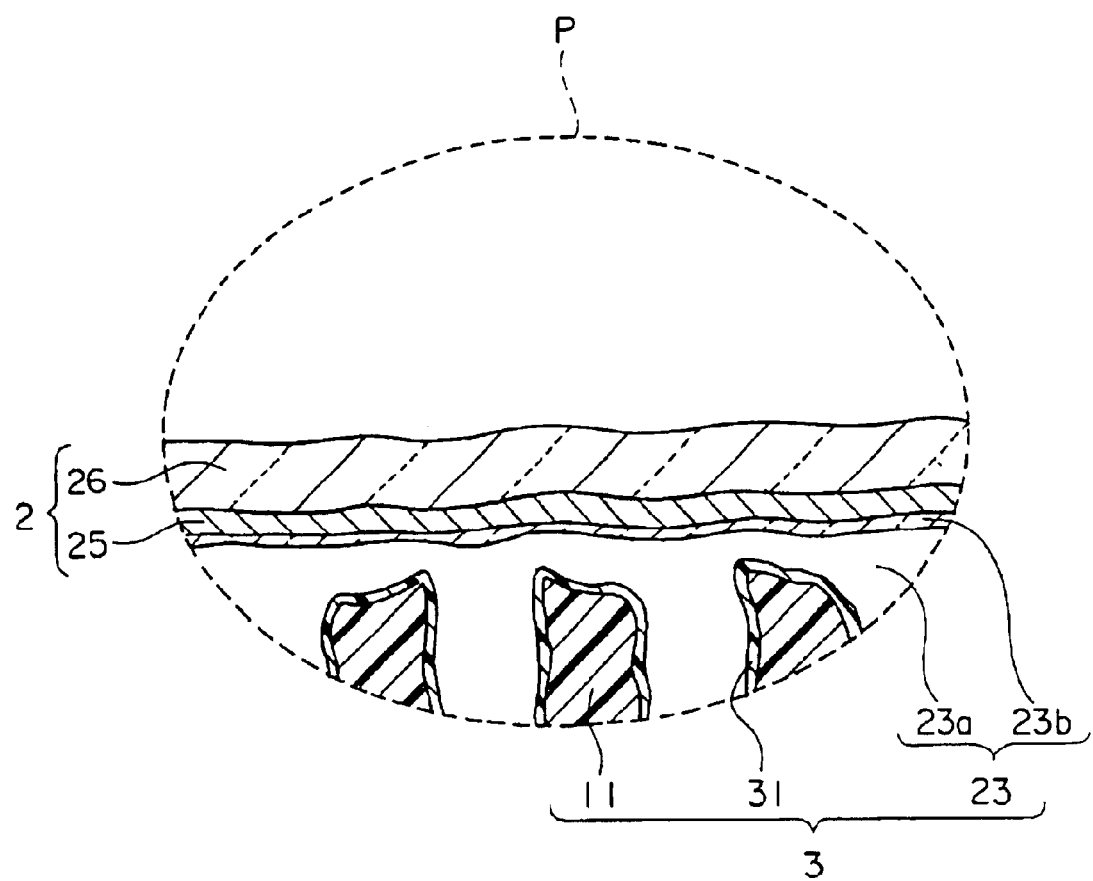
FIG. 2 is an exemplary enlarged view of a portion P of the transmission line type noise filter shown in FIGS. 1A to 1D.

Now, transmission line type noise filters according to preferred embodiments of the present invention will be described hereinbelow with reference to the drawings.

First Embodiment

Referring to FIGS. 1A to 1D, a noise filter 10 according to the first embodiment of the present invention is mounted on an electrode (not shown) of a mounting board 50.

The noise filter 10 comprises a tantalum fine wire 1 being a metal fine wire that has a predetermined length L and provides a valve operation, a conductor layer 2 having a length h and formed so as to cover the periphery of a central portion of the tantalum fine wire 1, a first anode terminal 4a and a second anode terminal 4b connected to both ends of the tantalum fine wire 1, respectively, a cathode terminal 5 connected to the conductor layer 2 using a conductive adhesive 6 such as silver paste, and a capacitance forming portion 3 provided between the tantalum fine wire 1 and the conductor layer 2.

In the present invention, valve-operational metal represents such metal in which, when oxidized, an oxidized film thereof performs a valve operation.

As shown in FIG. 2, the capacitance forming portion 3 comprises a tantalum sintered body 11 formed around the central portion of the tantalum fine wire 1 so as to be integral with the tantalum fine wire 1, an oxidized tantalum film 31 that is a dielectric film formed by oxidizing the surface of the tantalum sintered body 11, and a solid electrolyte layer 23 formed on the oxidized tantalum film 31. The capacitance forming portion 3 forms a solid electrolytic capacitance with the tantalum sintered body 11 and the solid electrolyte layer 23 serving as an anode and a cathode, respectively.

As shown In FIG. 2, the tantalum sintered body 11 is porous like a pumice and has a very rough surface, and thus the surface area thereof is large. Therefore, the area of the oxidized tantalum film 31 formed on the surface of the tantalum sintered body 11 is also very large For example, as compared with a capacitance forming portion having the same volume as the capacitance forming portion 3 and made of a different material according to a different manufacturing method, a very high capacitance can be achieved.

The solid electrolyte layer 23 is composed of two layers, i.e. a first conductive high molecular compound layer 23a directly contacting the oxidized tantalum film 31, and a second conductive high molecular compound layer 23b formed on the first conductive high molecular compound layer 23a. The solid electrolyte layer 23, however, may be composed of a layer of a single kind.

As shown in FIG. 2, the conductor layer 2 comprises a graphite layer 25 formed on the surface of the solid electrolyte layer 23, and a silver coating layer 26 formed on the surface of the graphite layer 25. The cathode terminal 5 is connected to the silver coating layer 26 using the conductive adhesive 6.

The length h of the conductor layer 2 and the size of a section of the conductor layer 2 perpendicular to a longitudinal direction of the tantalum fine wire 1 may be suitably determined depending on desired characteristics of the noise filter.

For the solid electrolyte layer 23, a conductive high molecular compound can be used that includes a monomer of a ring organic compound such as pyrrole, aniline, thiophene or furan, or a polymer of a derivative thereof. A layer of the conductive high molecular compound can be formed on the surface of the oxidized tantalum film 31 through chemical oxidative polymerization.

When forming the solid electrolyte layer 23 by a plurality of layers, such as two layers, of conductive high molecular compounds, a two-layer structure can be achieved by selection from the foregoing conductive high molecular compounds (duplicate selection of the same material is also possible). In this event, at least the conductive high molecular compound layer that directly contacts the surface of the oxidized tantalum film 31 is formed through chemical oxidative polymerization.

The noise filter 10 according to this embodiment has the tantalum fine wire 1 serving as a central conductor while constitutes a transmission line of a coaxial-line type having the conductor layer 2 serving as an external conductor. Therefore, as compared with the conventional two-terminal lumped constant noise filters, the noise filter 10 has a lower impedance in a high frequency band, and thus is excellent in noise removing performance in the high frequency band.

Further, inasmuch as the extremely large capacitance excellent in frequency characteristic can be realized between the tantalum fine wire 1 and the conductor layer 2, the impedance is very low over the wide frequency range even with the single noise filter, i.e. without using a plurality of capacitors having different self-resonance frequencies as in the conventional technique. As a result, the noise filter 10 can exhibit the excellent noise removing performance over the wide frequency range although its size is small and its structure is simple.

In addition, inasmuch as it is no longer necessary to select, design or use the plurality of capacitors as required in the conventional technique, the total manufacturing cost can be reduced.

Now, a manufacturing method of the noise filter 10 in this embodiment will be described.

Figure 3:
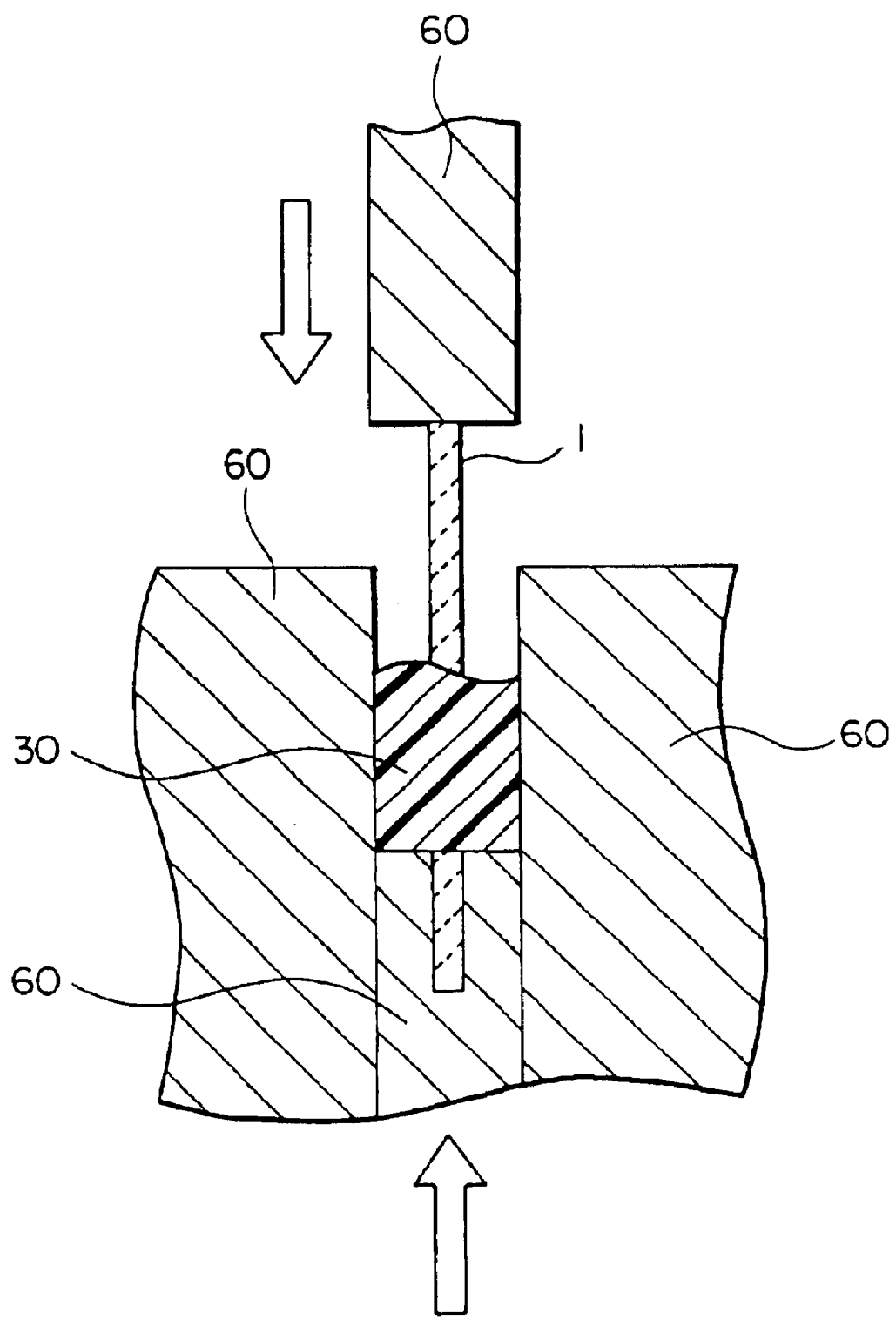
FIG. 3 is a diagram for explaining a manufacturing method of the transmission line type noise filter shown in FIGS. 1A to 1D, which is manufactured using press molding of tantalum powder.

First, a binder that volatilizes at a predetermined temperature is mixed into tantalum powder 30 being porous metal powder around the central portion, in a longitudinal direction (hereinafter referred to as "first direction"), of the rectilinear tantalum fine wire 1 having the predetermined length L, then the mixture is press-molded by a die 60 as shown in FIG. 3, for example, so as to have the length h in the first direction.

Subsequently, this press-molded mixture is sintered in a vacuum, thereby to obtain a tantalum sintered body (not shown). The binder volatilizes during sintering, and the residual tantalum sintered body is porous.

Subsequently, this tantalum sintered body is immersed into a phosphoric acid liquid and, while applying a positive voltage to the tantalum sintered body and a negative voltage to the phosphoric acid liquid to control a thickness thereof, the surface of the tantalum sintered body is oxidized, thereby forming the oxidized tantalum film (dielectric) 31 having a desired thickness.

Subsequently, the solid electrolyte layer 23 is formed on the surface of the oxidized tantalum film 31. Specifically, first, a polypyrrole layer, for example, is formed on the surface of the oxidized tantalum film 31 as the first conductive high molecular compound layer 23a through chemical oxidative polymerization, then a polypyrrole layer including conductive powder, for example, is formed on the first conductive high molecular compound layer 23a as the second conductive high molecular compound layer 23b through chemical oxidative polymerization or electrolytic oxidative polymerization.

Subsequently, the graphite layer 25 and the silver coating layer 26 are formed on the second conductive high molecular compound layer 23b in a stacked manner for drawing out a cathode-side electrode. Thereafter, the first anode terminal 4a is welded to one end of the exposed tantalum fine wire 1 and the second anode terminal 4b is welded to the other end thereof, and the cathode terminal 5 and the silver coating layer 26 are bonded together using the conductive adhesive 6, then the composite is packaged using, for example, epoxy resin (not shown), thereby completing the noise filter 10 as an electronic element.

In the present invention, the valve-operational metal is not limited to tantalum, and niobium (Nb) may also be used.

Second Embodiment

Figure 4A:
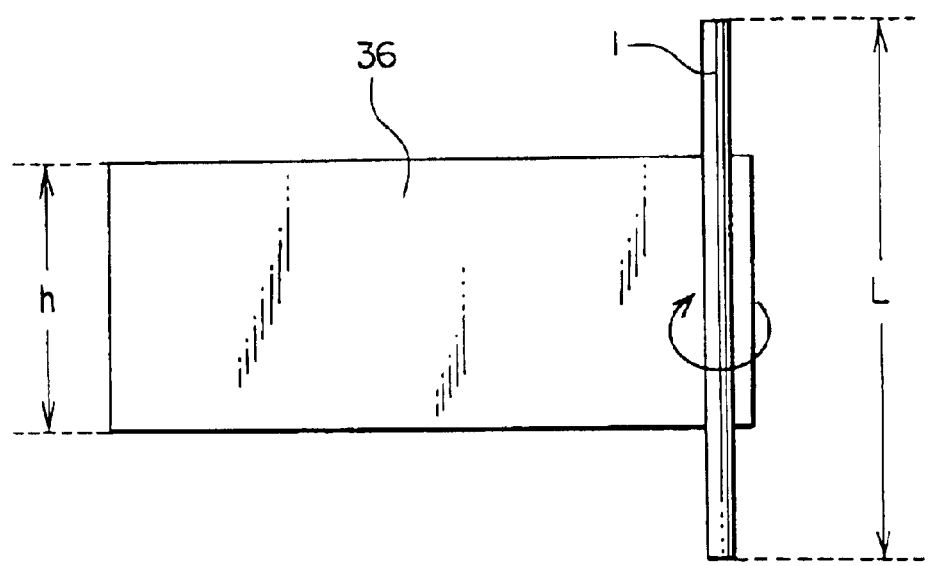
FIGS. 4A and 4B are diagrams for explaining a manufacturing method of a transmission line type noise filter according to a second preferred embodiment of the present invention, which is manufactured using a green sheet.
Figure 4B:
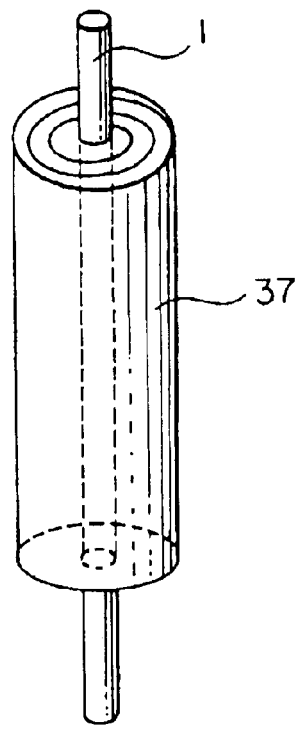

In the present invention, a manufacturing method as shown in FIGS. 4A and 4B can also be used with respect to a sintered body, other than the manufacturing method as described above using FIG. 3. Specifically, a green sheet 36 having a predetermined width h and thickness is formed from slurry including tantalum powder being porous metal powder and a binder that volatilizes at a predetermined temperature. Then, using a tantalum fine wire 1 having a predetermined length L (L>h) as a core, the green sheet 36 is wound around a central portion thereof a predetermined number of times, exposing both end portions of the tantalum fine wire 1.

Subsequently, It is sintered in a vacuum so as to obtain a sintered wound body 37. The binder volatilizes during sintering, and the residual sintered wound body 37 is porous.

Subsequently, the sintered wound body 37 is immersed into a phosphoric acid liquid and, while applying a positive voltage to the sintered wound body 37 and a negative voltage to the phosphoric acid liquid to control a thickness thereof, the surface of the sintered wound body 37 is oxidized, thereby forming an oxidized tantalum film (dielectric) having a desired thickness. Thereafter, the same processes as those in the first embodiment will be carried out.

Also in case of this configuration and manufacturing method, niobium powder may be used instead of tantalum powder.

Third Embodiment

Figure 5:
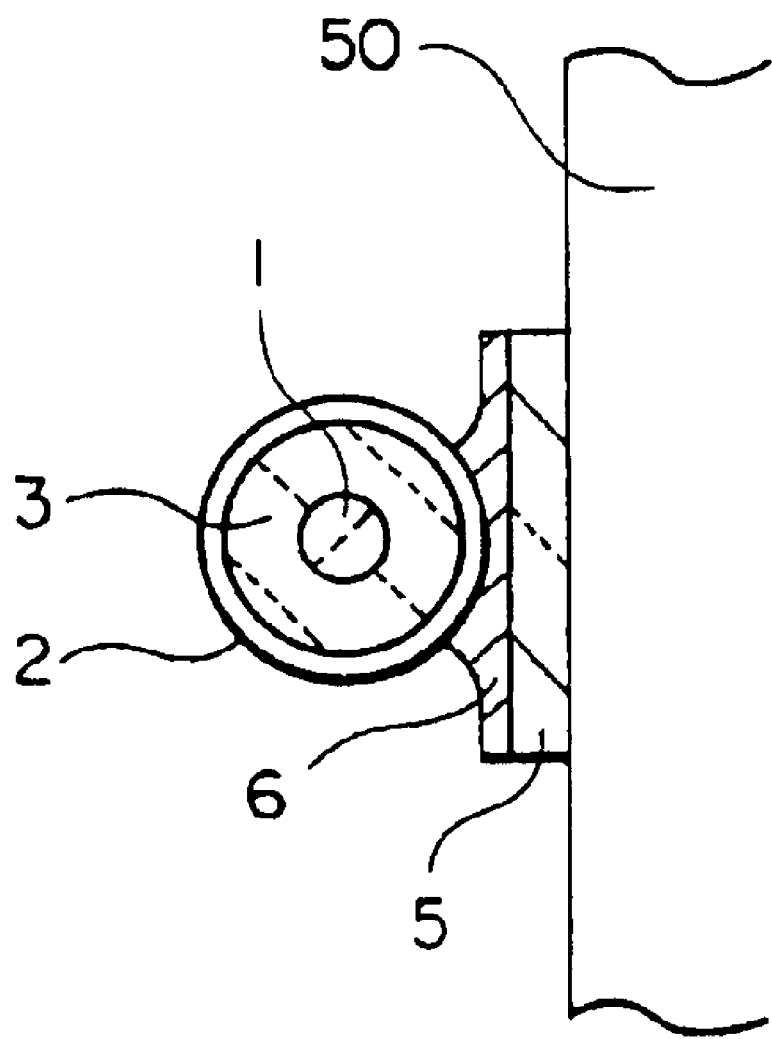
FIG. 5 is an exemplary sectional view, corresponding to FIG. 1D, of a transmission line type noise filter according to a third preferred embodiment of the present invention, which has a conductor layer whose external shape is cylindrical.

In the present invention, the external shape of the conductor layer 2 is not limited to a prismatic shape, i.e. a section of the conductor layer 2 perpendicular to the longitudinal direction of the tantalum fine wire 1 is not limited to a rectangular shape. Specifically, as shown in FIG. 5, the external shape may be cylindrical, i.e. a section of a conductor layer 2 and a capacitance forming portion 3 perpendicular to the longitudinal direction of the tantalum fine wire 1 may have a circular shape. Incidentally, FIG. 5 is a diagram corresponding to FIG. 1D when the conductor layer 2 and the capacitance forming portion 3 are cylindrical in shape.

While the present invention has thus far been described in conjunction with the embodiments thereof, it will readily be possible for those skilled in the art to put the present invention into practice in various other manners.

What is claimed is:

1. A transmission line type noise filter having a central conductor, an external conductor, and a dielectric formed between said central conductor and said external conductor, said transmission line type noise filter comprising:

a metal fine wire made of valve-operational metal and serving as said central conductor;

a capacitance forming portion formed over a predetermined length on the periphery of said metal fine wire; and a conductor layer formed on a surface of said capacitance forming portion and serving as said external conductor;

said capacitance forming portion comprising:

a sintered body formed on said metal fine wire and made of said valve-operational metal;

a dielectric film formed on a surface of said sintered body and serving as said dielectric; and a solid electrolyte layer formed on a surface of said dielectric film.

2. The transmission line type noise filter according to claim 1, wherein said sintered body is formed by press-molding powder of said valve-operational metal, then sintering it at a predetermined temperature.

3. The transmission line type noise filter according to claim 1, wherein said sintered body is formed by winding a green sheet formed from slurry including powder of said valve-operational metal, around said metal fine wire as a core, then sintering it at a predetermined temperature.

4. The transmission line type noise filter according to claim 1, wherein said dielectric film is made of an oxidized film of said valve-operational metal.

5. The transmission line type noise filter according to claim 1, wherein said valve-operational metal is tantalum or niobium.

6. The transmission line type noise filter according to claim 1, wherein said solid electrolyte layer is a conductive high molecular compound layer.

7. The transmission line type noise filter according to claim 1, wherein said solid electrolyte layer is made of a plurality of conductive high molecular compound layers.

8. The transmission line type noise filter according to claim 1, further comprising:

a first and a second anode terminal connected to both ends of said metal fine wire, respectively;

a cathode terminal connected to said conductor layer; and a resin package covering said metal fine wire, said capacitance forming portion and said conductor layer, excluding at least portions of said first and second anode terminals and said cathode terminal, respectively.

* * * * *